United States Patent [19]

Becke et al.

[11] Patent Number: 4,573,065

[45] Date of Patent: Feb. 25, 1986

[54] RADIAL HIGH VOLTAGE SWITCH STRUCTURE

[75] Inventors: Hans W. Becke, Morristown, N.J.; John C. Gammel, Robesonia, Pa.; Adrian R. Hartman, New Providence, N.J.; Muhammed A. Shibib, Wyomissing Hills, Pa.; Robert K. Smith, New Providence, N.J.

[73] Assignee: AT&T Bell Laboratories, Murray Hill, N.J.

[21] Appl. No.: 448,631

[22] Filed: Dec. 10, 1982

[51] Int. Cl.[4] ............... H01L 29/74; H01L 20/06; H01L 29/80

[52] U.S. Cl. .................................. 357/38; 357/20; 357/22

[58] Field of Search ............... 357/38, 22, 20, 38 P, 357/22 E

[56] References Cited

U.S. PATENT DOCUMENTS

| 3,958,267 | 5/1976 | Frederiksen et al. | 357/36 |
| 4,467,344 | 8/1984 | Chang et al. | 357/39 |
| 4,494,134 | 1/1985 | Wildi et al. | 357/22 |

Primary Examiner—Martin H. Edlow
Assistant Examiner—Terri M. Henn
Attorney, Agent, or Firm—David L Caplan

[57] ABSTRACT

A radial type of high voltage solid-state switch is essentially a gated diode switch (GDS) with portions of the anode, cathode, shield, and gate regions being arc portions of concentric circles which have different radii. The arc length and radius of the arc portions of the anode are less than the corresponding parameters of the shield and cathode. This structure, which is denoted as a radial gated diode switch, RGDS, has lower on resistance than a standard GDS of the same area and distance between anode and shield regions.

15 Claims, 5 Drawing Figures

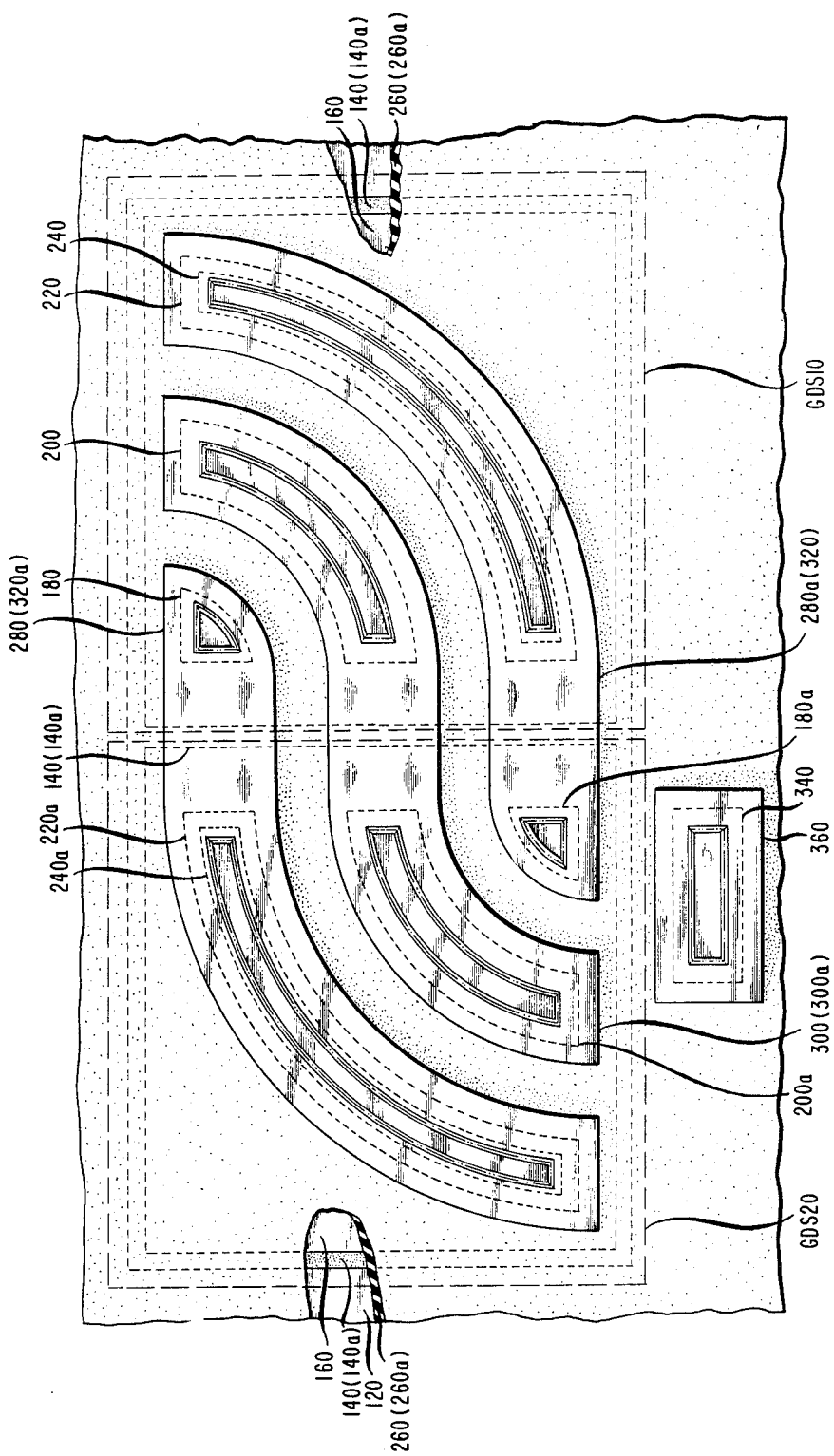

RADIAL HIGH VOLTAGE SWITCH STRUCTURE

TECHNICAL FIELD

This invention relates to high voltage switches and, in particular, to solid-state high voltage switches having relatively low on resistance.

BACKGROUND OF THE INVENTION

High voltage solid-state switches, such as the gated diode switch (GDS) and the thyristor which are both essentially p-i-n diodes, when in the on and conducting state, are characterized by dual carrier injection and typically use a shield region around the n cathode in order to increase the operating voltage range. Typically, the anode and cathode region of the GDS has a rectangular shape, as does the shield region surrounding the cathode. The on resistance of the gated diode switch, though relatively low, is still not as low as is desirable in some applications. One contributing cause to the on resistance of the GDS is that the emitting efficiency of the cathode is significantly below that of the anode because of the shield region.

It is desirable to have solid-state switches, such as the GDS, which have reduced on resistance as compared to the conventionally described GDS's.

SUMMARY OF THE INVENTION

One embodiment of the present invention is a structure comprising a semiconductor body having a bulk portion. Within the semiconductor body is a first region of one conductivity type and a second region of the opposite conductivity type. The first and second regions are of relatively low resistivity compared to the bulk portion of the semiconductor body. The structure is adapted to selectively facilitate or substantially inhibit current flow between the first and second regions. The first and second regions have perimeter profiles that face each other, with the length of the second region perimeter profile being greater than the length of the first region perimeter profile. The perimeter profiles which face each other each consist of a curve which may be a regular curve or which may have undulations about a regular curve or which may be a piecewise continuous curve. The first and second regions are separated from each other by an approximate constant distance with there being a preselected minimum distance between the closest adjacent portions of the perimeter of the first and second regions which face each other.

In a preferred embodiment, the structure further comprises a localized fourth region, which is conductive and contacts the semiconductor body, and is connectable to a separate electrode and a third region which is of the one conductivity type and which surround the second region. The fourth region is separated from the first and third regions by parts of the bulk portion of the semiconductor body and has first and side arc portions which face the side arcs of the first and third regions, respectively. The length of the side arcs of the fourth region is greater than the side arc of the first region. This preferred embodiment is useful as a gated diode switch which may be denoted as a radial gated diode switch (RGDS).

The structure of the present invention provides lower on resistance when it functions as a switch than conventional gated diode switch type structures or thyristors requiring the same silicon area and having the same distance between the first and third regions. This structure allows for favorable trade-offs between area and on resistance.

These and other novel features and advantages of the present invention are better understood from consideration of the following detailed description taken in conjunction with the accompanying drawings.

BRIEF DESCRIPTION OF THE DRAWING

FIG. 5 illustrates a top view of a structure in accordance with another embodiment of the invention which has the electrical circuit schematic of FIG. 4.

DETAILED DESCRIPTION

Figure 1:
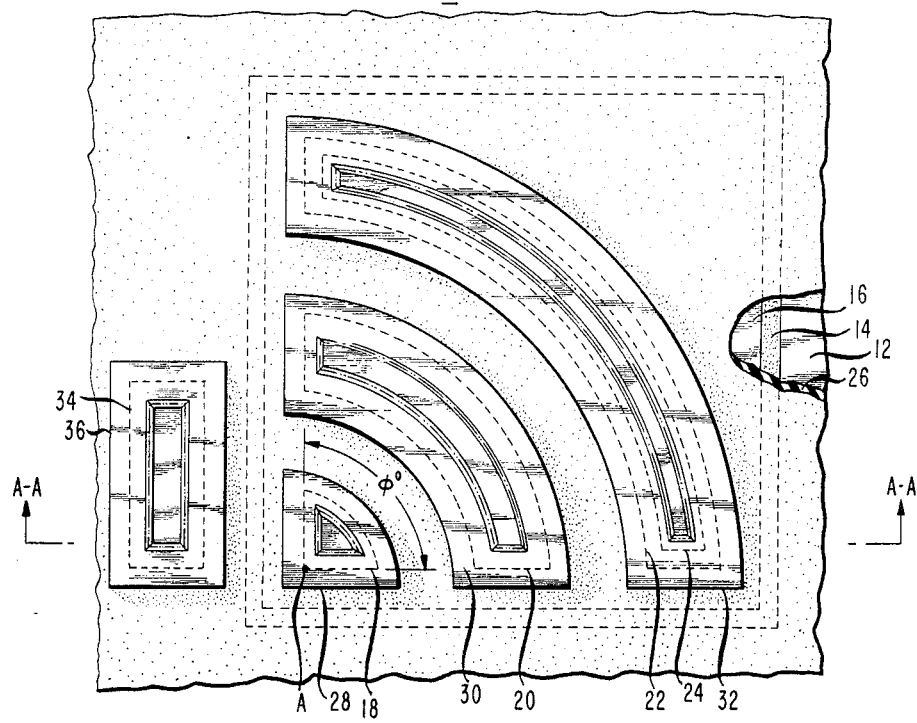
FIGS. 1 and 2 illustrate a top view and a cross-sectional view through line A—A of the top view, respectively, of a structure in accordance with one embodiment of the invention.
Figure 2:
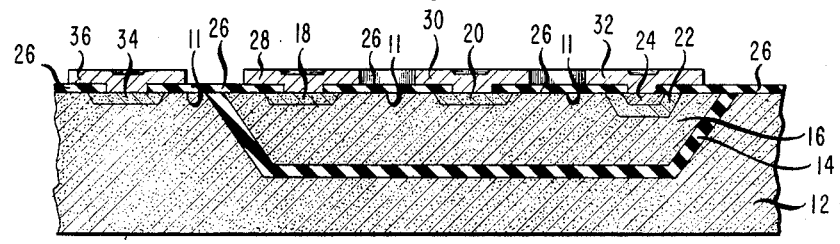

Referring now to FIGS. 1 and 2, there is illustrated a top view and a cross-sectional view taken along line A—A of the top view of a structure 10 comprising a support member 12 having a major surface 11 and a semiconductor body 16 whose bulk is of one conductivity type and which is separated from support member 12 by an insulator layer 14, which is typically a dielectric layer. The semiconductor body 16 has a portion that is common with surface 11. Structure 10 can be operated as a gated diode switch (GDS) and may be denoted as a radial diode switch (RGDS).

A localized first anode region 18, which is of the one type conductivity, is included in body 16 and has a portion thereof that extends to surface 11. A localized second gate region 20, which is of the opposite conductivity, also is included in body 16 and has a portion thereof which extends to surface 11. A localized third cathode region 24, which is of the opposite type conductivity, is included in body 16 and has a portion which extends to surface 11. A region 22, which is of the one type conductivity and has a portion which extends to surface 11, surrounds region 24 and acts as a depletion layer punch-through shield. Region 22 separates cathode region 24 from the bulk portion of semiconductor body 16. In addition, it acts to inhibit inversion of the portions of body 16 at or near surface 11 between regions 20 and 24. It also acts to increase the voltage blocking capability between gate region 20 and cathode region 24. Gate region 20 exists between anode region 18 and region 22 and is separated from both by bulk portions of body 16. The resistivities of regions 18, 20, and 24 are low compared to that of the bulk portions of body 16. The resistivity of region 22 is intermediate between that of anode region 18 and that of the bulk portions of body 16.

Electrodes 28, 30, and 32 are conductors which make low resistance contact to the surface portions of regions 18, 20, and 24, respectively. A dielectric layer 26 covers major surface 11 so as to isolate electrodes 28, 30, and 32 from all regions other than those intended to be electrically contacted. An electrode 36 provides a low resistance contact to support 12 by way of a highly doped region 34 which is of the same conductivity type as support 12.

Advantageously, the support 12 and the body 16 are each of silicon, and the support 12 may be either of n or p type conductivity. Each of electrodes 28, 30, and 32 advantageously overlaps the semiconductor region to which they make low resistance contact. Electrode 32 also overlaps region 22. This overlapping, which is known as field plating, facilitates high voltage operation because it increases the voltage at which breakdown occurs.

In one illustrative embodiment, substrate 12 and body 16 and regions 18, 20, 22, 24, and 34 are of n, p−, p+, n+, p, n+, and n+ type conductivity, respectively. Dielectric layer 14 is silicon dioxide, and electrodes 28, 30, 32, and 36 are all aluminum.

A plurality of separate bodies 16 can be formed in a common support 12 to provide a plurality of switches.

Structure 10 is typically operated as a switch which is characterized by a low impedance path between anode region 18 and cathode region 24 when in the on state and as a high impedance between said two regions when in the off (blocking) state. The type of structure described herein is denoted as gated diode switch (GDS). Substrate 12 is typically held at the most positive potential level available when body 16 is of p− type conductivity. It is held at the most negative potential level available when body 16 is of n− type conductivity. With operation potentials applied to the regions 18 and 24, the potential applied to gate region 20 determines the state of the switch. Regions 18 and 24 serve as the anode and cathode regions, respectively, when semiconductor body 16 is of p− type conductivity. Regions 18 and 24 serve as the cathode and anode regions, respectively, when semiconductor body 16 is of n− type conductivity.

With body 16 being of p− type conductivity, conduction between anode region 18 and cathode region 24 is inhibited or interrupted (cut off) if the potential of gate region 20 is sufficiently more positive than that of anode region 18, cathode region 24, and region 22. The amount of excess positive potential needed to inhibit or interrupt (cut off) conduction is a function of the geometry and impurity concentration (doping) levels of structure 10. This positive gate potential causes a vertical cross-sectional portion of body 16 between gate region 20 and the portion of dielectric layer 14 therebelow to be depleted and the potential of this portion of body 16 to be greater in magnitude than that of anode region 18, cathode region 24, and region 22. This essentially pinches off body 16 against dielectric layer 14 in the bulk portion thereof below gate region 20 and extending down to dielectric layer 14. The positive potential barrier of the aforesaid portion of body 16 is a potential which inhibits conduction of holes from anode region 18 to cathode region 24. If conduction exists between anode region 18 and cathode region 24 before the potential of the gate region 20 is raised to the high potential level, then gate region 20 serves to collect electrons emitted at cathode region 24 before they can reach anode region 18. This serves to help interrupt conduction between anode region 18 and cathode region 24. In addition, the high level potential of gate region 20 serves to cause a vertical cross-sectional portion of body 16 between gate region 20 and the portion of dielectric layer 14 therebelow to be depleted and the potential of this portion of body 16 to be greater in magnitude than that of anode region 18, cathode region 24, and region 22. The blocking (essentially nonconducting) state is the off state. The geometry and impurity concentrations of structure 10 are designed to help inhibit or interrupt current flow between anode region 18 and cathode region 24.

The voltage applied to semiconductor support 12 causes an electric field which extends through dielectric layer 14 and into semiconductor body 16. Normally, during the on state, electrons coat the bottom of semiconductor body 16 and act to shield it from the effect of the positive bias applied to substrate 12. With structure 10 biased to the off state, these electrons are removed from the bottom of semiconductor body 16 and drawn into gate region 20. This field tends to cause depletion of semiconductor body 16 and also helps cause the potential of the portion of the bulk portion of body 16 between gate region 20 and extending down to dielectric layer 14 to be greater in potential than anode region 18. The biased substrate 12 thus acts as a second or back gate which aids in switching structure 10 to the off state. Control circuitry capable of supplying the needed gate potentials and absorbing the electrons is illustrated and described in U.S. patent application Ser. No. 248,206 (A. R. Hartman-T. J. Riley-P. W. Shackle), filed Mar. 27, 1981, and which has a common assignee.

With semiconductor body 16 being of p− type conductivity, conduction from anode region 18 to cathode region 24 occurs if region 18 is forward-biased with respect to region 24, and the potential of gate region 20 is below a level which inhibits or interrupts conduction between anode region 18 and cathode regions 24. During the on state, holes are injected into body 16 from anode region 18, and electrons are injected into body 16 from cathode region 24. These holes and electrons can be in sufficient numbers to form a plasma which conductivity modulates body 16. This effectively lowers the resistance of body 16 such that the resistance between anode region 18 and cathode region 24 is relatively low when structure 10 is operating in the on state. This type of operation is denoted as dual carrier injection. Positively biased substrate 12 creates an electrical field which passes through the dielectric layer 14 and tends to deplete the bulk portion of body 16. Electrons emitted from cathode region 24 coat the bottom of body 16 and thus act to shield the effect of the electrical field created by biased substrate 12. These electrons invert the bottom of the bulk portion of body 16 which is adjacent dielectric layer 14. This limits the effect of biased substrate 12 and thus allows conduction between anode region 18 and cathode region 24.

Region 22 helps limit the punch-through of a depletion layer formed during operation between gate region 20 and cathode region 24 and helps inhibit formation of a surface inversion layer between these two regions. In addition, it facilitates gate region 20 and cathode region 24 being relatively closely spaced apart. This facilitates relatively low resistance between anode region 18 and cathode region 24 during the on state. It also serves to increase maximum operating voltage and to reduce leakage currents.

During the on state of structure 10, the junction diode comprising semiconductor body 16 and gate region 20 can become forward-biased. Current limiting means (not illustrated) are normally included to limit the conduction through the forward-biased diode. One example of such current limiting means is illustrated and described in U.S. patent application Ser. No. 248,206 (A. R. Hartman-T. J. Riley-P. W. Shackle), filed Mar. 27, 1981, and having a common assignee.

The on state can be achieved by having the potential of the anode region 18 greater than that of the cathode region 24 and forward-biasing the anode region 18 with respect to the gate region 20. Typically, 1-10 microamperes are pulled out of the gate region 20 while the anode-gate junction is forward-biased to cause structure 10 to assume the on state.

It is possible to operate structure 10 in the on state with the potential of gate region 20 at the same or a more positive level than that of anode region 18, cathode region 24, and region 22, so long as the potential of gate region 20 is below a level which essentially completely depletes a vertical cross-sectional portion of semiconductor body 16 between anode region 18 and cathode region 24. With the gate region 20 held at such a potential level, the junction diode comprising semiconductor body 16 and gate region 20 has a zero forward bias or is reverse-biased.

Structure 10 of FIGS. 1 and 2 differs from previous gated diode switch type structures in that the portions of the anode region 18, gate region 20, shield region 22, and cathode region 24 which essentially face each other are formed of portions of arcs of concentric circles having a common center point A. The arc length of the anode is therefore smaller than the arc length of the gate, and the arc length of the gate is smaller than the arc length of the shield. The arc length of the shield is greater than that of the cathode since the shield surrounds the cathode. The number of degrees ($\phi$) of the arc lengths of the anode, gate, and shield region is illustrated as approximately 90°, with the arc length of the cathode being approximately 84°.

It has been found that in the conventional GDS, which uses parallel rectangular anode, gate, shield, and cathode regions, that the efficiency of charge carrier emission at the cathode region is significantly lower than at the anode region. Even in the absence of a shield region, with rectangular p+ type anode and n+ type gate and cathode regions and a p− type semiconductor body, the efficiency of carrier emission at the cathode region is lower than at the anode region. This limits the on resistance of the GDS. The radial structure of the present invention, as illustrated in FIGS. 1 and 2, effectively and significantly increases cathode charge carrier emission efficiency while only marginally decreasing anode charge carrier efficiency. The net result is that a GDS having a structure like structure 10 of FIGS. 1 and 2 can be designed to have essentially the same area and distance between anode and cathode as a device with rectangular parallel anode and cathodes, but with a significantly lower on resistance.

It has been found that in many dual carrier injection structures that one of the injecting regions has a lower carrier injection efficiency than the other. One way of helping to equalize the two carrier injection efficiencies, and to achieve as high an injection efficiency for one region as the other, is to increase the perimeter of the portion of the less efficient charge carrier injection region versus the perimeter of the other region. The portions of the perimeters of the regions whose lengths must be adjusted are those who face each other. Various types of regular curves, such as ellipses, circles, parabolas, or other conic sections can be used for the facing portions of the perimeters of the anode and cathode regions. Also, sine or cosine waves or sawtooth waveforms or other piecewise continuous curves can be used. The gate region can likewise be any of these curves. The shield region typically has the same type of curve as the cathode region. The anode, cathode, and gate regions can all have different curves.

Structure 10 has been fabricated with the $\phi$ of the anode and shield regions=90°, $\phi$ of the gate region=118°, and $\phi$ of the cathode region=84°, the overall area of region 16 being 155,881 square microns, and the distance between the arc portion of the anode region 18 and shield region 24 is 171 microns. The on resistance is 8.5 ohms. This compares with 10.5 ohms for the conventional device having rectangular regions which has the same area as structure 10 and the same distance between the respective anode and shield regions.

Various trade-offs between total area and on resistance can be made. For example, a radial GDS can have designed a smaller area than the standard GDS structure but have the same on resistance. It can have the same area but lower on resistance, or it can have somewhat greater area but significantly lower on resistance.

It has been found that for a fixed distance between anode and cathode regions, the ratio of the arc length of the anode to cathode also affects on resistance. With a fixed distance between anode and cathode regions of 171 microns and a current flow between anode and cathode regions IA-K of 25 mA, it was found that the on resistance of the RGDS decreased 10 ohms to 7.5 ohms as the ratio of the arc length of the cathode to anode increased from 1.4 to 4.2. As the same ratio increased from 4.2 to 6.2, the on resistance increased from 7.5 ohms to 9 ohms. With IA-K=75 mA, the on resistance decreased from 8.1 ohms to 5.9 ohms as the ratio of the arc length of the cathode to anode increased from 1.4 to 4.2 As the same ratio increased from 4.2 to 6.2, the on resistance increased from 5.9 ohms to 7.3 ohms. With a conventional GDS having rectangular anode and cathode regions and a spacing of 171 microns between anode and cathode, the measured on resistance is 10.9 ohms and 9.3 ohms, for IA-K=25 mA and 75 mA, respectively.

Figure 3:
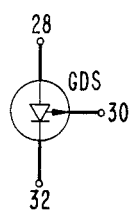
FIG. 3 illustrates an electrical circuit symbol for the structure of FIGS. 1 and 2.

FIG. 3 illustrates an electrical symbol for this type of switch. The anode, gate, and cathode electrodes of the GDS are denoted as terminals 28, 30, and 32, respectively.

One embodiment of the structure 10 has been fabricated with the following design. Support member 12 is an n type monocrystalline silicon substrate, 18 to 22 mils thick, with an impurity concentration of approximately $5 \times 10^{13}$ impurities/cm$^3$ and has a resistivity greater than 100 ohm-centimeter. Dielectric layer 14 is a silicon dioxide layer that is 2 to 4 microns thick. Body 16 is typically 35 to 65 microns thick, approximately 391 microns long, 391 microns wide, and is of p type conductivity, with an impurity concentration in the range of approximately $5-9 \times 10^{13}$ impurities/cm$^3$. Anode region 18 is of p+ type conductivity, is typically 2 to 4 microns thick, 32 microns wide, and has a $\phi=90°$ and a radius from point A of 32 microns, and has an impurity concentration of approximately $10^{19}$ impurities/cm$^3$. Electrode 28 is typically aluminum and has a thickness of 1½ microns and a radius from point A of 56 microns. Region 20 is of n+ type conductivity and is typically 2 to 30 microns thick, has a $\phi=118°$, and a first radius from point A of 98 microns, and has a second radius from point A of 130 microns, and has an impurity concentration of approximately $10^{19}$ impurities/cm$^3$. The depth of region 20 is determined by the thickness of body 16. Electrode 30 is typically aluminum and has a thickness of 1½ microns. The spacing between adjacent edges of electrodes 28 and 30 is 37 microns and between adjacent edges of electrodes 30 and 32 is typically 40 microns. Region 22 is p type conductivity and is typically 3 to 6 microns thick, has a $\phi=90°$, and a radius from point A of 203 microns, and has an impurity concentration of approximately $10^{17}$ to $5 \times 10^{18}$ impurities/cm$^3$. Cathode region 24 is n+ type conductivity and is typically 2 to 4 microns thick, has a $\phi=84°$, and a radius of 209 microns, and has an impurity concentration of approximately $10^{19}$ impurities/cm$^3$. Electrode 32 is aluminum and has a thickness of 1½ microns and has a radius from point A of 191 microns. The spacing between the ends of regions 18 and 22 and the respective ends of region 16 is typically 60 microns. Region 34 is n+ type conductivity and is typically 2 microns thick, 26 microns wide, 62 microns long, and has an impurity concentration of $10^{19}$ impurities/cm$^3$. Electrode 36 is aluminum which is 1½ microns thick, 38 microns wide, and 78 microns long. Insulating (dielectric) layer 26 is typically 3 to 5 microns thick. $\phi=90°$.

Structure 10, using the parameters denoted above, has been operated as a gated diode switch (GDS) with 660 volts between anode and cathode. A layer of silicon nitride (not illustrated) was deposited by chemical vapor deposition on top of silicon dioxide layer 26 to provide a sodium barrier. Electrodes 28, 30, 32, and 36 were then formed, and thereafter a coating of radio frequency plasma deposited silicon nitride (not illustrated) was applied to the entire surface of structure 10 except where electrical contact is made. The layers of silicon nitride serve to help prevent high voltage breakdown in the air between adjacent electrodes.

Typically the anode had +330 volts applied thereto, the cathode had −330 volts applied thereto, and substrate 12 had +360 volts applied thereto. These applied potentials result in the anode and cathode being essentially electrically isolated from each other and little or no current flow between anode and cathode. The −330 volts can also be applied to the anode and the +330 volts applied to the cathode without damage to structure 10. The anode and cathode remain essentially electrically isolated from each other, and there is little or no current flow between anode and cathode. Thus, structure 10 bilaterally blocks voltage between anode and cathode. A potential of +360 volts applied to gate electrode 30 interrupted (broke) 120 mA of current flow between anode region 18 and cathode region 24. When the potential of the gate electrode 30 is switched from +360 volts to essentially one junction voltage drop below the potential of the anode, the GDS switches from the off state to the on state. The on resistance of the GDS with 30 mA flowing between anode and cathode is approximately 8.5 ohms, and the voltage drop between anode and cathode is typically 1.3 volts.

In the above-described fabricated embodiment, the gate region has a somewhat greater $\phi$ (118° vs. 90°) than the anode region in order to potentially provide better current break capability. The number of degrees $\phi$ of each of the regions need not be the same.

Structure 10 is described to increase the total net efficiency of charge carrier emission from anode region 18 and cathode region 24 so as to reduce the on resistance of structure 10. The choice of making the arc length of a side of cathode region 24 greater than that of the arc length of a side of anode region 18 tends to increase the charge carrier injection efficiency of region 24 versus region 18. For the embodiment fabricated, cathode region 24, even without the inclusion of shield region 22, typically has a lower charge carrier efficiency than anode region 18. With the inclusion of shield region 24, the effective charge carrier efficiency of cathode region 22 is further reduced. The arc length of cathode region 24, greater than anode region 22, increases the charge carrier injection efficiency of cathode region 24 versus anode region 18. A reduction in the size of the arc portion of anode 18 beyond a certain point can significantly reduce its charge carrier efficiency to a point that there can be a net loss in overall charge carrier efficiency. One desirable embodiment would use a cathode region having as long an arc length relative the arc length of anode region 18, as is possible with a minimum arc length for anode region 18 such that the overall net charge carrier efficiency of structure 10 is as high as is practically possible. This will result in helping to reduce on resistance.

Structure 10 can be used as a type of bipolar transistors with region 20 serving as the collector, region 24 serving as the emitter, and regions 18 and 22 and semiconductor body 16 serving as the base. As long as the potential applied to the collector (region 20) is below the level which inhibits or interrupts current flow between regions 18 and 24 and the base (body 16 and region 22) is forward-biased with respect to the emitter (region 24), conduction between the collector (region 20) and the emitter (region 24) occurs. Base current which supports this conduction originates from base contact region 18. If the collector voltage is increased to a level which is sufficient to cut off conduction between regions 18 and 24, then the base current from region 18 is cut off and, consequently, conduction between the collector (region 20) and the emitter (region 24) is also cut off.

It has been discovered that decreasing the impurity concentration of the bulk portion of semiconductor body 16 of structure 10 of FIG. 1 causes a modification in the mode of operation. Starting with the above design parameters, but with the impurity concentration of the bulk of semiconductor body 16 at approximately $1 \times 10^{13}$ instead of $9 \times 10$—impurities/cm$^3$, it was found that with the potential of gate region 20 at approximately the same level as anode region 18, conduction between anode region 18 and cathode region 24 is inhibited or interrupted (cut off) except for a relatively low level flow. This is the off (high impedance) state. With a positive bias applied to anode region 18 relative to cathode region 24, and with gate region 20 allowed to essentially electrically float in potential, substantial current flow can exist between anode region 18 and cathode region 24. This is the on (low impedance) state. The relatively low level current flow of the off state helps in switching structure 10 to the on state. Control circuitry useful to control the state of a structure 10 which has the operating characteristics described in this paragraph is described in U.S. patent application Ser. No. 248,206 (A. R. Hartman-T. J. Riley-P. W. Shackle).

One major advantage of structure 10, which has a semiconductor body 16 whose impurity concentration is as described immediately hereinabove, is that the gate potential need only be at that of the anode potential to switch the structure to the off state. It is thus not necessary to use a higher potential than exists at the anode in order to operate structure 10. Many applications require high voltage and high current switches, but the most positive potential available is that applied to one of the terminals of the switch. This embodiment of structure 10 can be used in such applications so long as a limited amount of current flow can be tolerated between the anode and cathode regions when structure 10 is in the off state. It is, however, necessary to maintain fairly tight tolerances on the impurity concentration of semiconductor body 16 in order to operate structure 10 as indicated.

Figure 4:
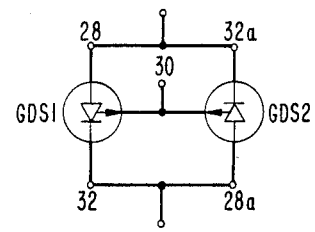
FIG. 4 illustrates an electrical circuit schematic of a bidirectional switch.

Referring now to FIG. 4, there is illustrated a bidirectional switch combination comprising two GDS's (GDS1 and GDS2) in accordance with the present invention, with electrode 28 (the anode electrode of GDS1) electrically coupled to electrode 32a (the cathode electrode of GDS2), the electrode 32 (the cathode electrode of GDS1) electrically coupled to electrode 28a (the anode electrode of GDS2). This switch combination is capable of conducting signals from electrodes 28 and 32a to electrodes 28a and 32 or vice versa. The bilateral blocking characteristic of structure 10 facilitates this bilateral switch combination. Two separate bodies 16 can be formed in a common support 12, and the appropriate electrical connections can be made to form the above-described bidirectional switch. A plurality of separate bodies 16 can be formed in a common support 12 to form an array of switches.

Referring now to FIG. 5, there is illustrated a semiconductor structure 100 comprising two essentially identical gated diode switches GDS10 and GDS20 which are illustrated within dashed line rectangles and are both formed in a semiconductor wafer 120. Each of GDS10 and GDS20 is essentially identical in structure to structure 10 of FIGS. 1 and 2. GDS10 and GDS20 are electrically connected together in the same way as are GDS1 and GDS2 of FIG. 4 and as such form a bidirectional switch. The regions and other components and metallization of GDS10 which correspond to those of structure 10 of FIGS. 1 and 2 have the same designation with an extra "0" added. The regions and other components and metallization of GDS20 which correspond to those of structure 10 of FIGS. 1 and 2 have the same designation with a "0a" added. A first common electrode 300 (300a) is connected to gate region 200 of GDS20 and to gate region 200a of GDS10. A second common electrode 320 (280a) is connected to anode region 180a and to cathode region 220. A third electrode 280 (320a) is connected to anode region 180 and to cathode region 240.

The embodiments described herein are intended to be illustrative of the general principles of the invention. Various modifications are possible consistent with the spirit of the invention. For example, for the designs described, support members 12 and 120 can alternatively be p type conductivity silicon, gallium arsenide, sapphire, a conductor, or an electrically inactive material. If support members 12 and 120 are electrically inactive materials, then dielectric layers 14, 140, and 140a can be eliminated. Still further, bodies 16, 160, and 160a can be fabricated as air isolated type structures. This allows for the elimination of support members 12 and 120 and dielectric layers 14, 140, and 140a. Further, the electrodes can be doped polysilicon, gold, titanium, or other types of conductors. Still further, the impurity concentration levels, spacings between different regions, and other dimensions of the regions can be adjusted to allow significantly different operating voltages and currents than are described. Additionally, other types of insulating (dielectric) materials, such as silicon nitride or Semi-Insulating Polycrystalline Oxygen Doped Silicon (SIPOS) can be substituted for silicon dioxide. Still further, the conductivity type of all regions within the dielectric layer can be reversed provided the voltage polarities are appropriately changed in the manner well known in the art. It is to be appreciated that two structures of the present invention with common gate terminals and the anode of each coupled to the cathode of the other allow alternating or direct current operation. Still further, a single semiconductor substrate can contain some semiconductor bodies which are of p− type conductivity and some which are of n− type conductivity. Still further, in some applications which do not require the breaking of current between anode and cathode, the gate region can be eliminated. Still further, the semiconductor bodies can be n− type conductivity, with the anode being p+ type conductivity and the cathode being n+ type conductivity, as is the case in pending U.S. patent application Ser. No. 248,207, filed Mar. 27, 1981 (A. R. Hartman-T. J. Riley-P. W. Shackle). Still further, the semiconductor bodies can be essentially intrinsic. Still further, the structure can be modified such that two RGDS's can be formed in a single semiconductor body as is taught in G. K. Chang-A. R. Hartman-H. T. Weston, Ser. No. 333,700, filed Dec. 23, 1981, and having a common asignee. Still further, a resistor can be coupled between the anode and shield regions, and the structure can be used as is described in U.S. patent application Ser. No. 333,461 (A. R. Hartman-T. J. Riley-P. W. Shackle), filed, Dec. 22, 1981, in which there is a common assignee. Still further, the gate region can be a buried gate, as is taught in A. R. Hartman-A. U. Mac Rae-P. W. Shackle, Ser. No. 333,762, filed Dec. 23, 1981, in which there is a common assignee, or can be a remote gate as is taught in J. E. Berthold-A. R. Hartman-T. J. Riley-P. W. Shackle, Ser. No. 248,281, filed Mar. 27, 1981, in which there is a common assignee. Still further, the structure can be fabricated as a junction GDS as is taught in A. R. Hartman-B. T. Murphy-T. J. Riley-P. W. Shackle, Ser. No. 248,205, filed Mar. 27, 1981, in which there is a common assignee. Still further, the gate and shield regions of structures 10 and 100 can be eliminated, and the semiconductor body can be of p or n type conductivity or essentially intrinsic. Such a structure is essentially a p-i-n type diode, with the "i" being essentially intrinsic or of p or n type conductivity. Still further, in such a p-i-n structure, a shield region could be added to increase the operating voltage range. Still further, structures 10 and 100 can be used with a p+ type anode region, an n+ type cathode region, a p type shield region, and an n type semiconductor body, but without gate regions 20 or 200 but with separate electrodes connected to anode regions 18, 180, cathode regions 24, 240, and shield regions 22, 220. Such a device is essentially a thyristor. Still further, the arc portions of the anode and cathode regions which face each other need not be just portions of arcs of concentric circles; one or both can be parametric curves.

What is claimed is:
1. A structure comprising:
   a semiconductor body having a bulk portion and a major surface;
   a localized first region of the body which is of a one conductivity type; and
   a localized second region of the body which is of the opposite conductivity type;
   the localized first and second regions being of relatively low resistivity as compared with the bulk of the semiconductor body and being separated from each other by portions of the bulk of the semiconductor body;

each of the first and second regions having a respective portion that forms part of the major surface and having a separate electrode connected thereto;

a localized third region, which is of the one conductivity type and of lower conductivity than that of the first region, surrounding the second region so as to separate it from the bulk portion of the semiconductor body;

the first, second, and third regions each having a side arc portion which is essentially an arc of each of a plurality of concentric circles having mutually different radii, the radius of the circle corresponding to the second region being greater than the radius of the circle corresponding to the first region;

the length of the side arc portion of the second region being greater than the length of the side arc portion of the first region;

the ratio of the length of the side arc portion of the second region to that of the first region being such that in response to a forward applied bias a current flow between the first and second regions is facilitated in which the charge carrier injection efficiencies of the first and second regions are substantially equal.

2. The structure of claim 1 further comprising:
a localized fourth region which is conductive and contacts the semiconductor body, said fourth region being connectable to a separate electrode and being separated from the first and third regions by parts of the bulk portion of the semiconductor body; and the fourth region having first and second arc side portions which face the arc portions of the first and third regions, respectively; the length of the arc portions of the fourth region being greater than the length of the arc portion of the first region.

3. The structure of claim 2 wherein the fourth region is a localized semiconductor region of the opposite conductivity type.

4. The structure of claim 3 wherein the first, second, third, and fourth regions are of p+, n+, p, and n+ type conductivity, respectively.

5. The structure of claim 4 wherein the semiconductor body is of p− type conductivity.

6. The structure of claim 4 wherein the semiconductor body is of n− type conductivity.

7. The structure of claim 4 wherein the semiconductor body is essentially intrinsic.

8. The structure of claim 3 wherein the first, second, third, and fourth regions are of n+, p+, n, and p+ type conductivity, respectively.

9. The structure of claim 8 wherein the semiconductor body is of n− type conductivity.

10. The structure of claim 8 wherein the semiconductor body is of p− type conductivity.

11. The structure of claim 8 wherein the semiconductor body is essentially intrinsic.

12. The structure of claim 1 further comprising:
a support member;
an insulating dielectric layer; and
the insulating dielectirc layer separates the semiconductor body from the semiconductor support member.

13. The structure of claim 12 further comprising a plurality of semiconductor bodies separated from one another and all being separated from the support member by an insulating layer(s).

14. The structure of claim 13 wherein the support member is a semiconductor support member of p type conductivity and is adapted to facilitate electrical contact thereto.

15. The structure of claim 13 wherein the support member is a semiconductor support member of n type conducitivity and is adapted to facilitate electrical contact thereto.

* * * * *